(12) United States Patent
Chiang et al.

(10) Patent No.: US 10,371,909 B2
(45) Date of Patent: Aug. 6, 2019

(54) THERMAL INTERFACE

(71) Applicant: FINISAR CORPORATION, Sunnyvale, CA (US)

(72) Inventors: Troy Wy Piew Chiang, Singapore (SG); Julia Koh, Singapore (SG); Tat Ming Teo, Singapore (SG); William H. Wang, Pleasanton, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/457,717

(22) Filed: Mar. 13, 2017

(65) Prior Publication Data

US 2017/0261711 A1  Sep. 14, 2017

Related U.S. Application Data

(60) Provisional application No. 62/307,063, filed on Mar. 11, 2016.

(51) Int. Cl.
*G02B 6/42* (2006.01)
*H05K 7/20* (2006.01)
*H04B 10/50* (2013.01)

(52) U.S. Cl.
CPC ......... *G02B 6/4267* (2013.01); *G02B 6/4269* (2013.01); *G02B 6/4271* (2013.01); *G02B 6/4273* (2013.01); *G02B 6/4292* (2013.01); *H05K 7/2039* (2013.01); *G02B 6/4246* (2013.01); *H04B 10/50* (2013.01)

(58) Field of Classification Search
CPC . H01L 2224/48091; H01L 2924/12042; H01L 2224/32225; H01L 2924/181; H01L 2224/16225; H01L 2224/73204; H01L 2224/73265; H01L 2224/45015; H01L 2924/207; G06F 1/20; G06F 1/181; H05K 7/20418; H05K 1/181; H05K 2201/10015; H05K 5/0095; H05K 9/00; H05K 1/0203; H05K 7/20409; H05K 9/0015; G02B 6/4201; G02B 6/4261; G02B 6/4277; G02B 6/4284; G02B 23/2461; G02B 23/2484; G02B 6/4267; G02B 6/4292; G02B 6/4271; G02B 6/4269; G02B 6/4273; H04B 10/50
See application file for complete search history.

(56) References Cited

U.S. PATENT DOCUMENTS 3,391,242 A  7/1968  Sudges
4,151,547 A  4/1979  Rhoades et al.
(Continued)

OTHER PUBLICATIONS

International Search Report and Written Opinion dated Jun. 23, 2017, in related PCT Application No. PCT/US2017/022189 (26 pages).

*Primary Examiner* — Adam B Dravininkas
(74) *Attorney, Agent, or Firm* — Maschoff Brennan (57) ABSTRACT

A thermal interface may include a thermally conductive cap. The thermally conductive cap may include a base, a finger, and an extension. The base may define a plurality of cap openings. The finger may extend from the base. The extension may extend from the base. The thermal interface may also include a gasket defining a plurality of gasket openings. The gasket may be located on the base of the cap such that the gasket openings are positioned over the cap openings.

19 Claims, 7 Drawing Sheets

(56) References Cited

U.S. PATENT DOCUMENTS

| | | | |
|---|---|---|---|
| 2003/0021310 A1* | 1/2003 | Harding | H01L 23/4093 372/36 |
| 2003/0152340 A1* | 8/2003 | Kurashima | G02B 6/4246 385/92 |
| 2004/0074661 A1* | 4/2004 | Schiaffino | G02B 6/42 174/539 |
| 2004/0151443 A1 | 8/2004 | Mizue | |
| 2005/0158052 A1* | 7/2005 | Larson | G02B 6/4201 398/135 |
| 2005/0162761 A1* | 7/2005 | Hargis | G02B 7/008 359/820 |
| 2005/0264998 A1 | 12/2005 | McCutcheon et al. | |
| 2005/0286579 A1* | 12/2005 | Yoshikawa | H01L 23/4093 372/36 |
| 2010/0149759 A1* | 6/2010 | Nguyen | H05K 7/1428 361/740 |
| 2010/0296817 A1 | 11/2010 | Togami et al. | |
| 2011/0206328 A1* | 8/2011 | Wang | G02B 6/4246 385/94 |
| 2013/0156418 A1* | 6/2013 | Stapleton | H04B 10/40 398/25 |
| 2013/0163917 A1* | 6/2013 | Amirkiai | G02B 6/4201 385/14 |
| 2013/0182390 A1* | 7/2013 | Teo | G02B 6/4266 361/707 |
| 2015/0096732 A1* | 4/2015 | Teo | G02B 6/4266 165/185 |

* cited by examiner

THERMAL INTERFACE

CROSS-REFERENCE TO RELATED APPLICATIONS

This application claims the benefit of U.S. Provisional Patent Application No. 62/307,063, filed Mar. 11, 2016, titled THERMAL INTERFACE FOR COMMUNICATION MODULE, which is incorporated herein by reference in its entirety.

BACKGROUND

Communication modules, such as electronic or optoelectronic transceivers or transponder modules, are increasingly used in electronic and optoelectronic communication. Each communication module typically communicates with a host device printed circuit board by transmitting and/or receiving electrical data signals to and/or from the host device printed circuit board. The communication module can also transmit electrical data signals outside a host device as optical and/or electrical data signals. Many communication modules include optical subassemblies (individually, an "OSA") such as transmitter optical subassemblies (individually, a "TOSA") and/or receiver optical subassemblies (individually, a "ROSA") to convert between the electrical and optical domains.

Generally, a ROSA transforms an optical signal received from an optical fiber or other source to an electrical signal provided to the host device, while a TOSA transforms an electrical signal received from the host device to an optical signal emitted onto an optical fiber or other transmission medium. A photodiode or similar optical receiver contained by the ROSA transforms the optical signal to the electrical signal. A laser diode or similar optical transmitter contained within the optical subassembly is driven to emit an optical signal representing the electrical signal received from the host device.

SUMMARY

This Summary is provided to introduce a selection of concepts in a simplified form that are further described below. This Summary is not intended to identify key features or essential characteristics of the claimed subject matter, nor is it intended to be used as an aid in determining the scope of the claimed subject matter.

Embodiments may include a thermal interface may including a thermally conductive cap. The thermally conductive cap may include a base, a finger, and an extension. The base may define a plurality of cap openings. The finger may extend from the base. The extension may extend from the base. The thermal interface may also include a gasket defining a plurality of gasket openings. The gasket may be located on the base of the cap such that the gasket openings are positioned over the cap openings.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. These drawings depict only example embodiments of the invention and are therefore not to be considered limiting of its scope. The invention will be described and explained with additional specificity and detail through the use of the accompanying drawings.

DESCRIPTION

The process of converting optical signals to electrical signals and electrical signals to optical signals can generate thermal energy in optical subassemblies (individually, an "OSA") such as transmitter optical subassemblies (individually, a "TOSA") and/or receiver optical subassemblies (individually, a "ROSA"). The thermal energy generated in the optical subassembly may potentially cause damage to the optical subassembly. Additionally, high-temperature environments can create unstable thermal conditions that can cause ineffective optical subassembly function.

For example, for a TOSA, a high temperature environment can reduce laser performance or can cause premature laser failure. High temperatures may also cause problems to epoxies, solder, and/or other bonding materials in the optical subassembly. These high temperatures may become too great to be effectively dissipated and controlled by a thermoelectric cooler (TEC) installed in the optical subassembly.

Some embodiments may include a thermal interface to dissipate heat produced by an optical subassembly. In some configurations, the thermal interface may conduct heat from an optical subassembly, such as a TOSA, to a shell or housing of the communication module housing the optical subassembly. In some embodiments, the optical subassembly may also include a TEC. Where a TEC is included, the thermal interface may facilitate more effective heat dissipation and control by the TEC. For example, the thermal interface may encourage relatively manageable heat levels.

Reference is made to the drawings, where similar or equivalent components are referenced using the same reference numbers.

Figure 1A:
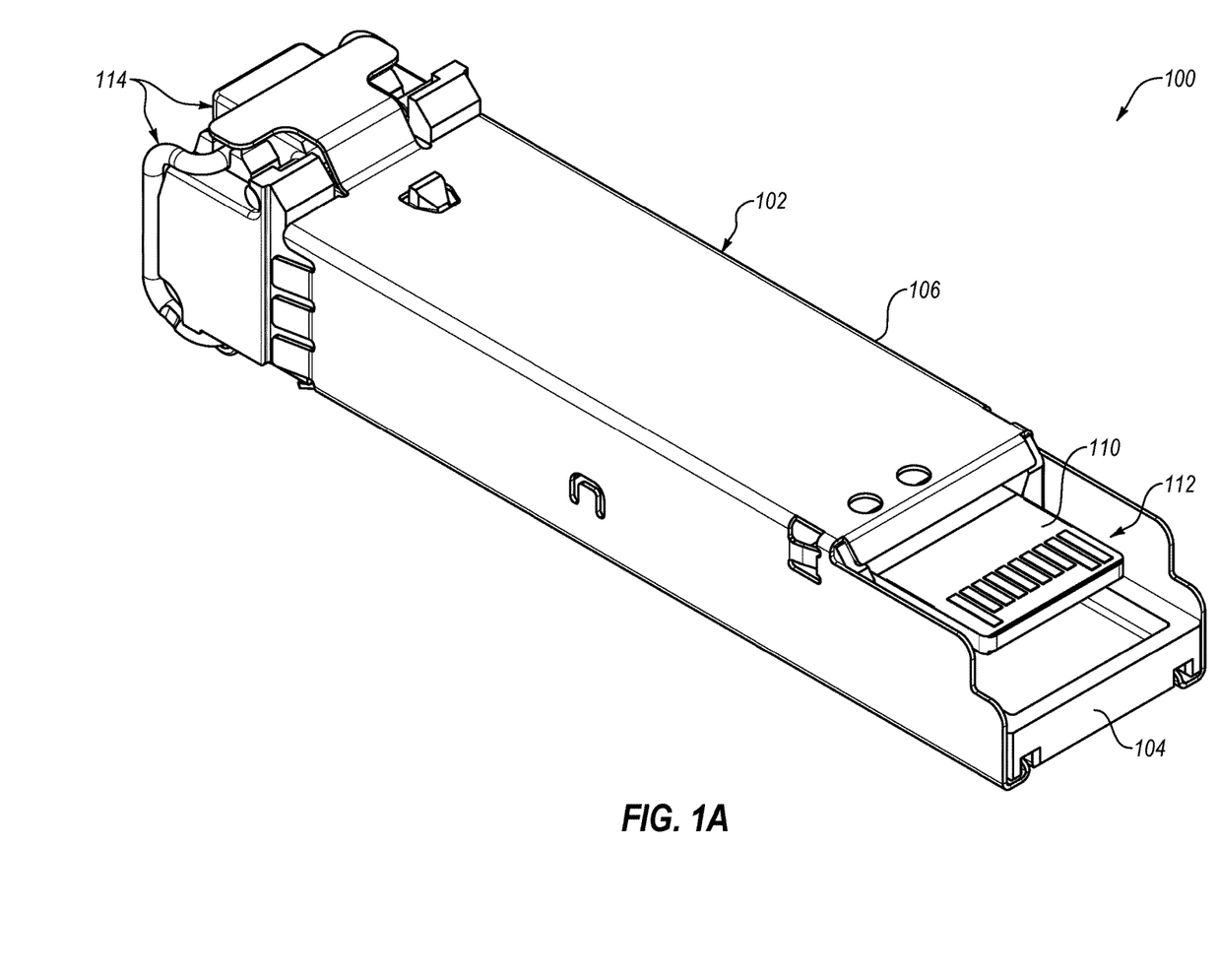
FIG. 1A illustrates a bottom perspective view of an optoelectronic module.
Figure 1B:
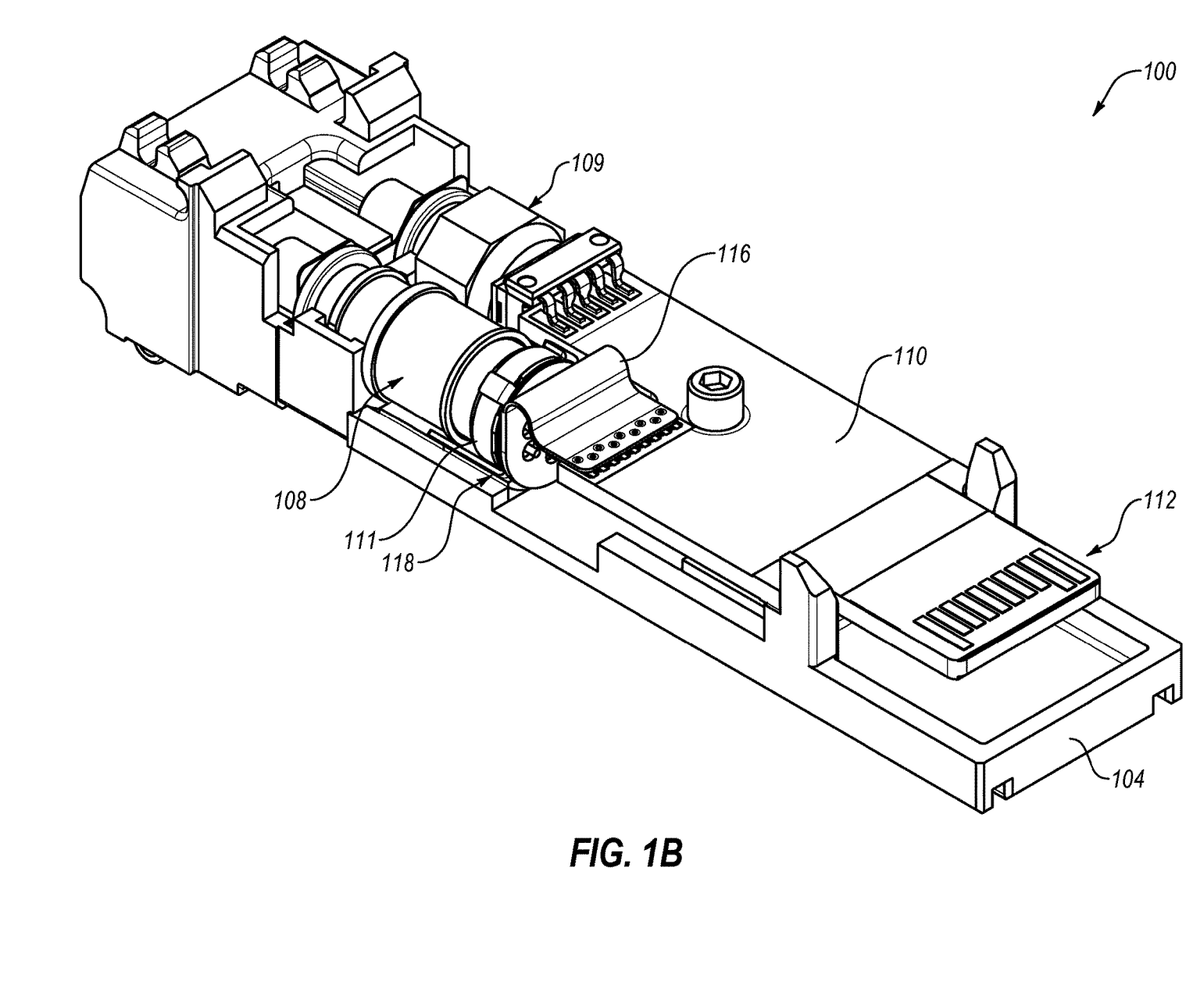
FIG. 1B illustrates a partial bottom perspective view of the optoelectronic module of FIG. 1A.
Figure 1C:
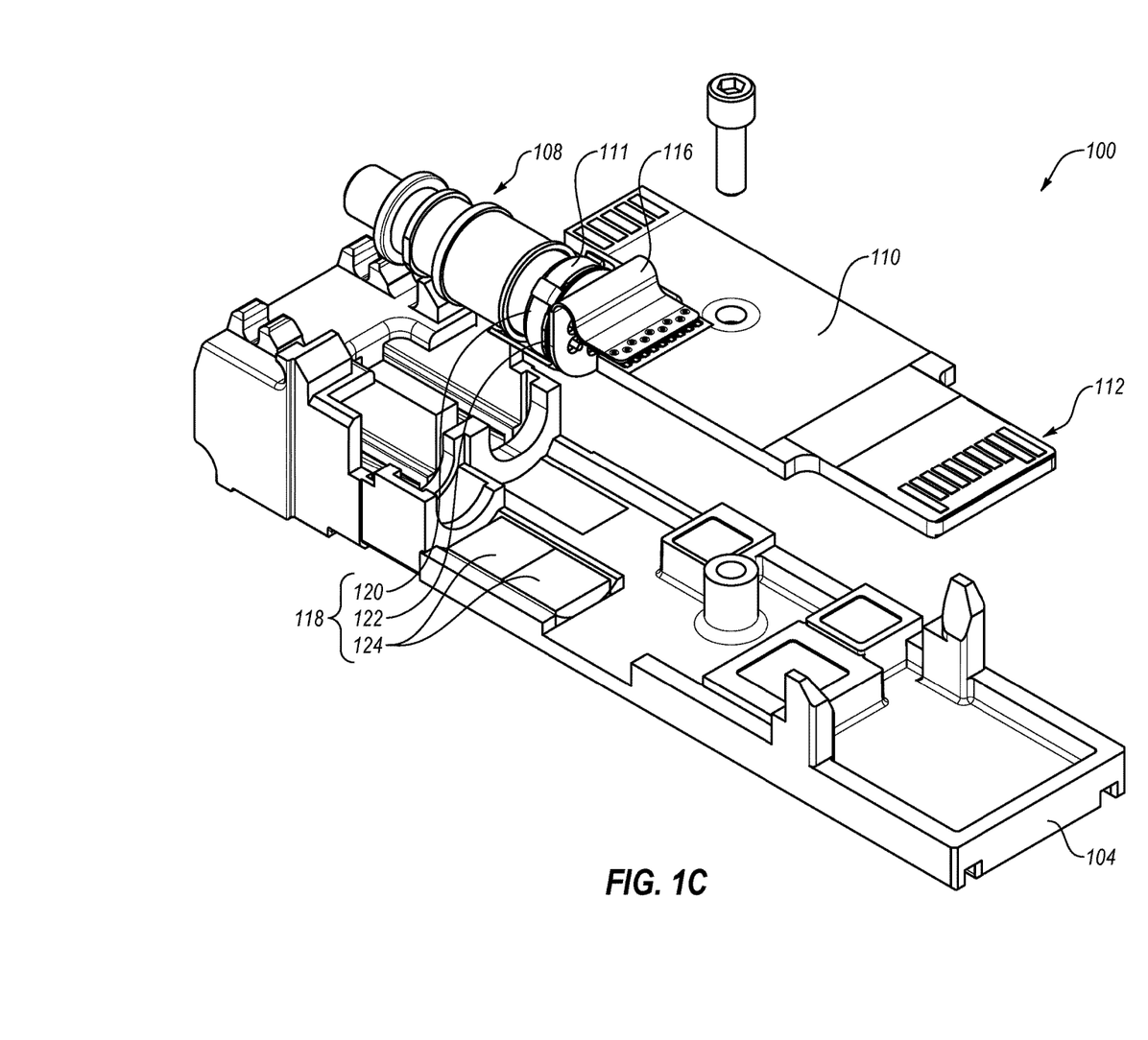
FIG. 1C illustrates a partial exploded bottom perspective view of the optoelectronic module of FIG. 1A.

FIGS. 1A-1C illustrate various bottom perspective views of an example optoelectronic module 100.

FIG. 1A illustrates a bottom perspective view of the optoelectronic module 100, including a housing 102 that may include a shell 104 and a shell cover 106 attached together. The optoelectronic module 100 may include a latch mechanism 114 movingly positioned relative to the housing 102. The latch mechanism 114 may allow the optoelectronic module 100 to be selectively secured relative to a host device.

The housing 102 may at least partially surround receiver and/or transmitter circuitry, including a printed circuit board (PCB) 110 having an edge connector 112 configured to be electrically coupled to the host device. For example, the optoelectronic module 100 may be configured to be inserted into a host device cage of the host device such that the edge connector 112 may be electrically coupled to a connector of a host printed circuit board.

In general, the optoelectronic module 100 may be employed in the communication of optical signals and the conversion of optical signals to and from electrical signals. In connection, the host device may be employed in the communication of corresponding electrical signals.

The optoelectronic module 100 may include a transmit port and a receive port at a front of the optoelectronic module 100. The optoelectronic module 100 may be configured for optical signal transmission and reception via the transmit port and the receive port at a variety of data rates including, but not limited to, 1.25 Gb/s, 2.125 Gb/s, 2.5 Gb/s, 2.7 Gb/s, 4.25 Gb/s, 8.5 Gb/s, 10.3 Gb/s, 10.5 Gb/s, 11.3 Gb/s, 14.025 Gb/s, or 100 Gb/s or higher.

The optoelectronic module 100 may be configured for optical signal transmission and reception at various wavelengths including, but not limited to, 850 nm, 1310 nm, 1470 nm, 1490 nm, 1510 nm, 1530 nm, 1550 nm, 1570 nm, 1520-1570 nm, 1590 nm, or 1610 nm. The optoelectronic module 100 may be configured to support various communication protocols including, but not limited to, Optical Fast Ethernet, Optical Gigabit Ethernet, 10 Gigabit Ethernet, and 1×, 2×, 4×, 8×, and 16× Fibre Channel.

In addition, although one example of the optoelectronic module 100 is configured to have a form factor that is substantially compliant with the SFP MSA, the optoelectronic module 100 may alternatively be configured in a variety of different form factors that are substantially compliant with other MSAs including, but not limited to, the QSFP MSA, the QSFP+MSA, the CFP MSA, the CFP2 MSA, the CFP4 MSA, the XFP MSA, or the SFP+MSA. Finally, although the optoelectronic module 100 is illustrated as a pluggable optoelectronic transceiver module, example embodiments disclosed herein may alternatively be employed, for example, in connection with other communications modules, other optoelectronic devices, or the like.

FIG. 1B illustrates a bottom perspective view of the optoelectronic module 100 of FIG. 1A with the shell cover 106 and the latch mechanism 114 omitted. The optoelectronic module 100 includes a TOSA 108 and a ROSA 109.

The TOSA 108 may include a TEC. A body of the header 111 of the TOSA 108 may be formed from a nickel-cobalt ferrous alloy associated with the trademark Kovar, which is owned by CRS Holdings, Inc. The alloy may be employed, at least in part, for its thermal expansion properties, which may closely resemble the thermal expansion properties of glass, and which may facilitate glass-to-alloy assemblies capable of being exposed to a range of temperatures. Alternately or additionally, the body of the header 111 may include other materials. The material used in the header 111 may exhibit a relatively low thermal conductivity. For example, Kovar may exhibit a thermal conductivity approximately half that of copper. Thus, for example, a thermally conductive connection between the TOSA 108 and the shell 104 that relies significantly on conductive heat transfer through the header 111 may exhibit relative inefficiency.

A connector 116 may communicatively connect the TOSA 108 to the PCB 110. Thus, for example, the TOSA 108 may exchange signals with and/or receive electrical power from the PCB 110 via the connector 116. The connector 116 may include a flex PCB that is soldered to the PCB 110 and soldered to the TOSA 108.

FIG. 1C illustrates an exploded bottom perspective view of the optoelectronic module 100 of FIG. 1B. In some embodiments, a thermal interface 118 may include a cap 120, a gasket 122, and a pad 124. The use of the term gasket does not imply that the gasket 122 facilitates a fluid-tight connection. The pad 124 may include a pliant thermal interface material (TIM) and may exhibit a relatively high thermal conductivity. The pad 124 may be located within a seat of the shell 104. When the TOSA 108, including the cap 120, is positioned within the shell 104 during assembly, the pad 124 may be compressed such that the TOSA 108 and the cap 120 are accommodated. In some embodiments, the pad 124 may include multiple portions, as illustrated. Alternatively, the pad 124 may be one piece.

Figure 2A:
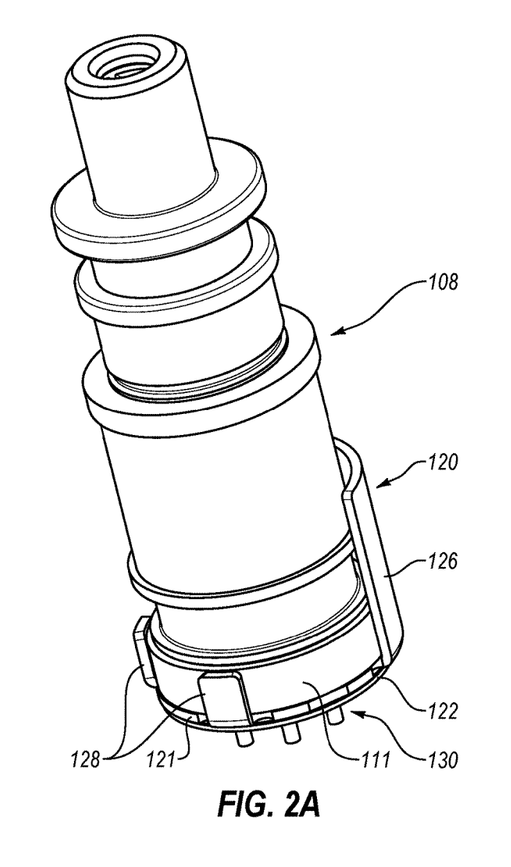
FIGS. 2A and 2B illustrate side perspective views of an assembly including a transmitter optical subassembly (TOSA), a cap, and a gasket.
Figure 2B:
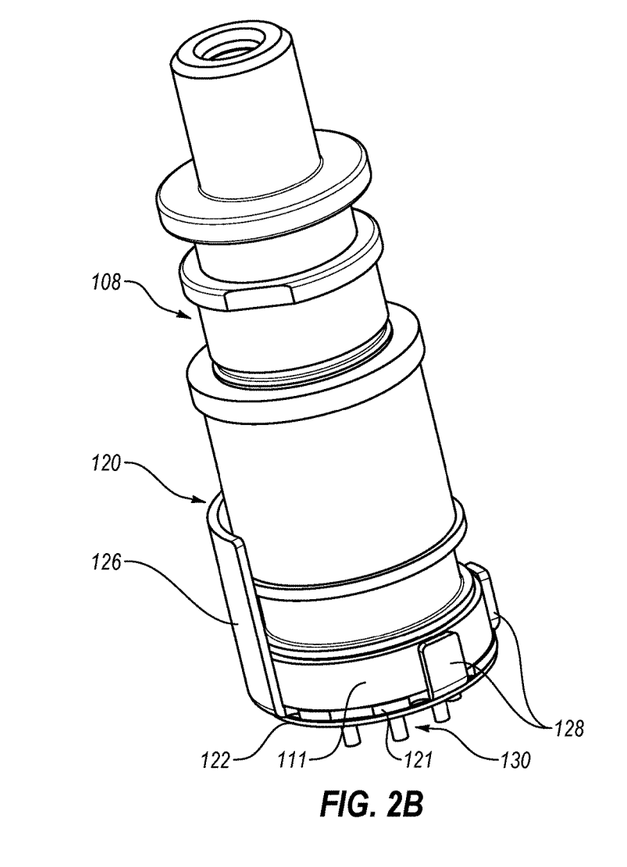
Figure 2C:
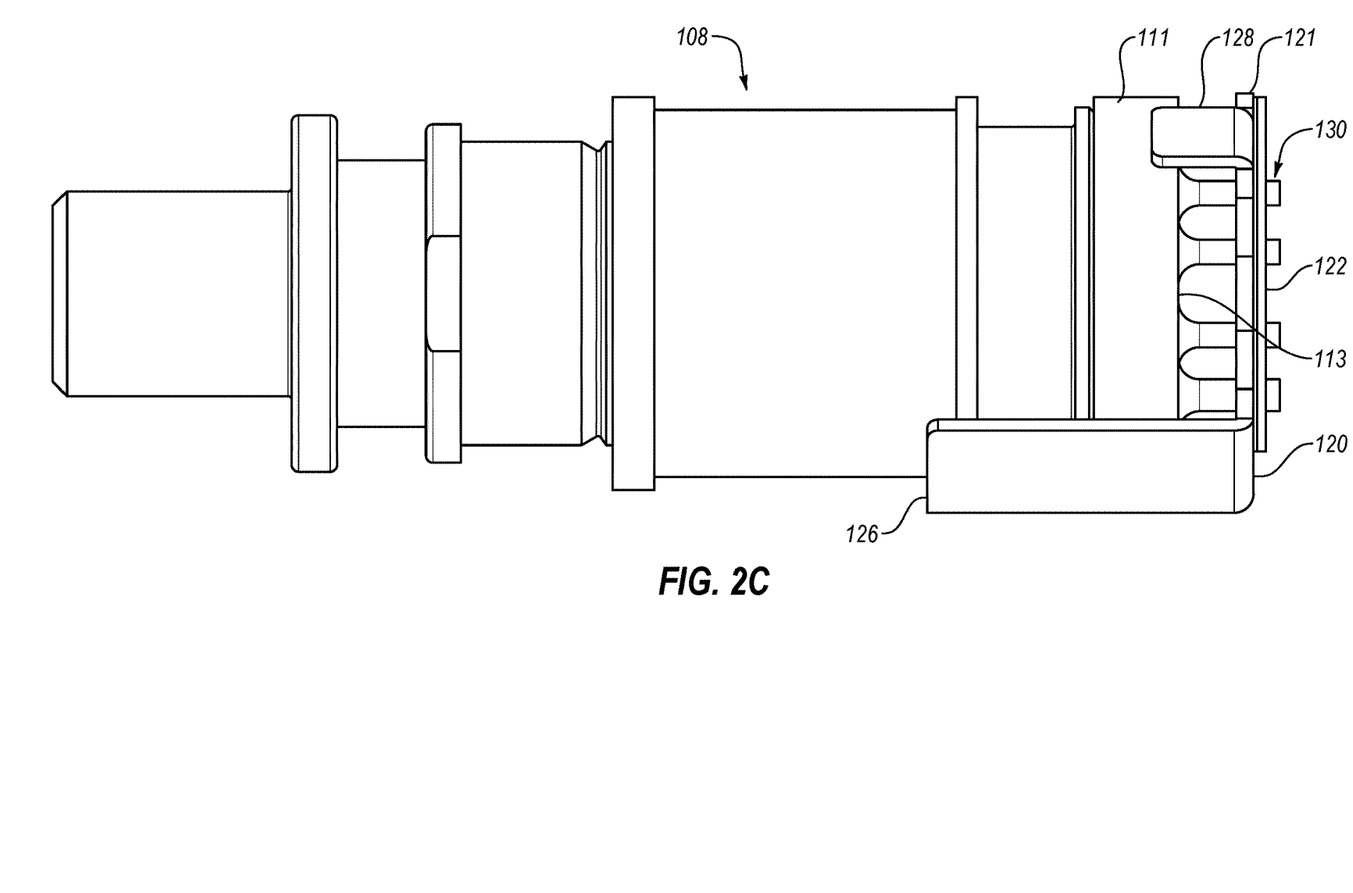
FIG. 2C illustrates an exploded side view of the assembly of FIGS. 2A and 2B.

FIGS. 2A and 2B illustrate side perspective views of the TOSA 108, the cap 120, and the gasket 122 of FIGS. 1A-1C. FIG. 2C is an exploded side view of the TOSA 108, the cap 120, and the gasket 122.

With reference to FIGS. 2A-2C, the cap 120 may exhibit a relatively high thermal conductivity. For example, the cap 120 may be formed from copper, plated copper, one or more copper alloys, and/or one or more other materials exhibiting a relatively high thermal conductivity. In some embodiments, the cap 120 may be manufactured at least in part via one or more stamping processes.

The cap 120 may include one or more fingers 128 and an extension 126. The fingers 128 may be sized and shaped to be positioned at the side of the header 111. In some embodiments, the fingers 128 may have a length approximately equal to the length of the header 111 and/or a relatively wide portion of the header 111. For example, the fingers 128 may have a length approximately equal to a base portion of the header 111. Alternately, the fingers 128 may have some other length that may facilitate the positioning of the cap 120 on the header 111. The extension 126 may also be sized and shaped to be positioned at a side of the header 111. The extension 126 may have a longer length than the fingers 128. For example, the extension 126 may have a length longer than the header 111 or longer than a base portion of the header 111. The width of the extension 126 may correlate with the size of a corresponding seat width of the shell 104 of FIGS. 1A-1C. The extension 126 may include a length suitable for facilitating a desired rate of thermal energy transfer from the portion of the cap 120 in contact with the header 111 to the pad 124 and shell 104.

The cap 120 includes a base 121 located on an end face 113 (shown in FIG. 2C) of the header 111, which may be an external face of a wall of the header 111 that includes electrically conductive leads 130 (described herein as an end wall). The leads 130 may be attached to the connector 116 and allow the TOSA 108 to be operated.

Within the body of the header 111, some or all of the leads 130 are conductively attached to components, such as a laser, a TEC, controlling circuitry, and the like. Most or all of the TOSA 108 components may be located on or near an internal face of the end wall of the header 111. Thus, for example, the end wall and the end face 113 may receive relatively more thermal energy generated by the TOSA 108 components than other portions of the header 111. Thermal energy from the end wall and nearby portions of the header 111 may flow to the base 121 of the cap 120. From there, thermal energy may flow to the extension 126.

In some embodiments, portions of the cap 120, such as the base 121, may be located relatively closer to the source of heat within the header 111 relative to conventional heat transfer devices. Furthermore, the cap 120 may exhibit a relatively large area of contact to the end face 113 and sides of the header 111, which may encourage a relatively high rate of heat transfer from the header 111 to the cap 120 via conduction.

With reference to FIGS. 1B-1C and 2A-2C, the pad 124 may be shaped to contact both the shell 104 and the extension 126 of the cap 120 and thermal energy may transfer conductively from the extension 126 of the cap 120 to the shell 104 via the pad 124. Compressing the pad 124 may reduce or eliminate air-filled gaps, which may inhibit the transfer of thermal energy, between the pad 124 and the cap 120 and/or the shell 104.

The pad 124 may facilitate a relatively more efficient thermally-conductive connection between the cap 120 and the shell 104 than direct contact between the cap 120 and shell 104. For example, direct contact between the cap 120 and the shell 104 may be imperfect and may result in air-filled gaps between the cap 120 and the shell 104. Alternately or additionally, direct contact between the cap 120 and the shell 104 may cause deviations in the thermal conductivity exhibited by the connection when the optoelectronic module 100 is subjected to movement. In some embodiments, the pad 124 may be omitted. For example, direct contact may be made between the cap 120 and the shell 104.

In some embodiments, the configuration of the thermal interface 118 may facilitate a floating OSA configuration of optoelectronic module 100. Thus, for example, the TOSA 108 may not be overly mechanically restrained and may accommodate variations in connector dimensions, manufacturing tolerances, or the like. Alternately or additionally, the configuration of the thermal interface 118 may resist deviations in the thermal conductivity exhibited by the thermal interface 118 when the optoelectronic module 100 is subjected to movement.

In some embodiments, the thermal interface 118 may facilitate a reduction of power consumption by the optoelectronic module 100. In some embodiments, power consumption may be reduced by up to 26.4 milliwatts (mW). Alternately, power consumption may be reduced by more than 26.4 mW. Thus, for example, the thermal interface 118 may facilitate a reduction in yield loss. In some embodiments, the thermal interface 118 may be employed in communication modules having a high power transistor outline-can (TO-can) based OSA.

Figure 3:
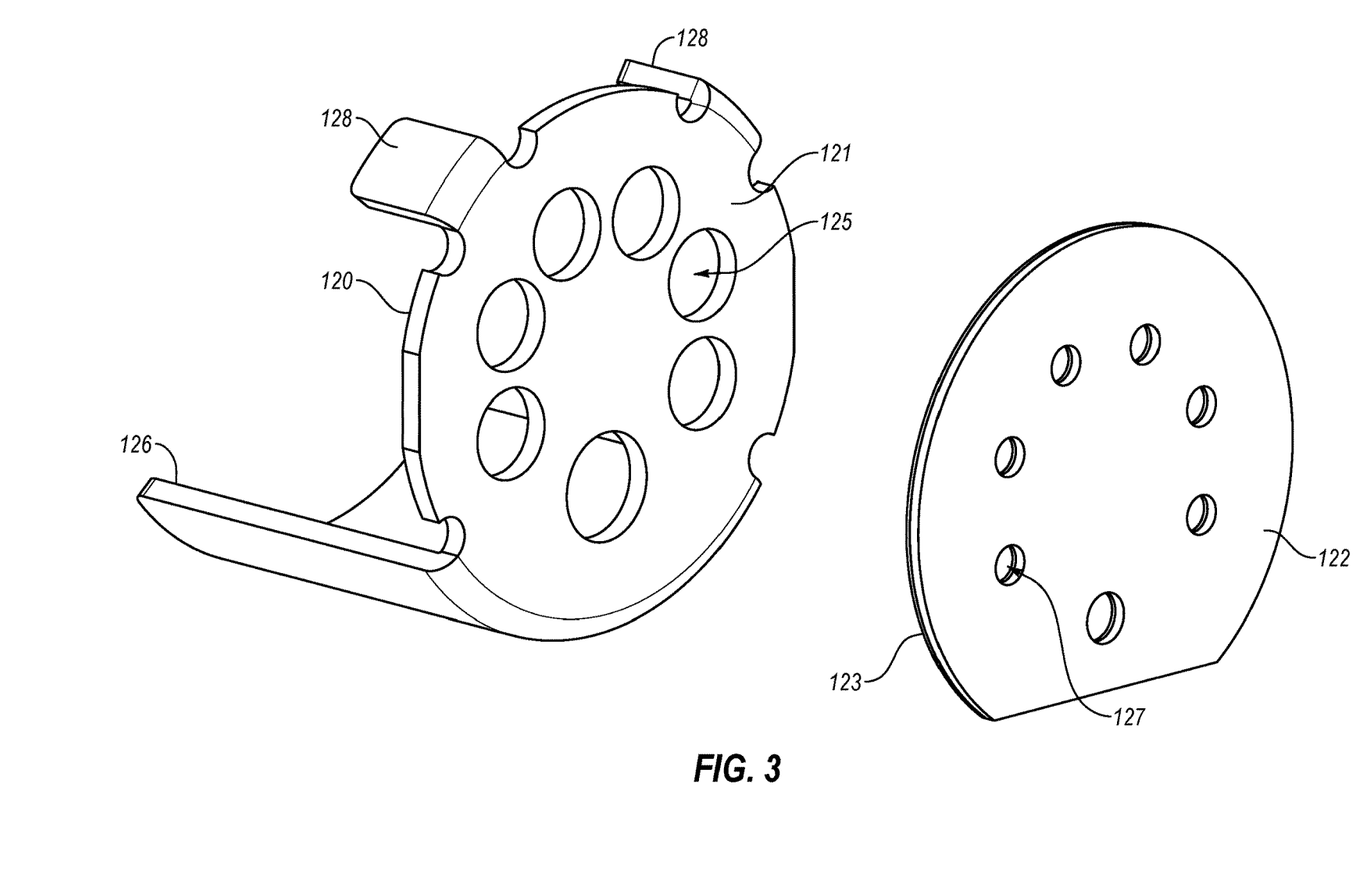
FIG. 3 illustrates an exploded perspective view of the cap and the gasket of FIGS. 2A-2C.

FIG. 3 is an exploded perspective view of the cap 120 and the gasket 122. Openings 125 formed in the cap 120 (described herein as "cap openings 125") and corresponding openings 127 formed in the gasket 122 (described herein as "gasket openings 127") may be configured to allow the leads 130 of the header 111, (shown in FIGS. 2A-2C), to pass through the cap 120 and the gasket 122 such that the leads 130 may be soldered to the connector 116 (FIGS. 1B-1C). The gasket 122 may be attached to the cap 120 via an adhesive 123, such as an adhesive tape, an epoxy, or the like. Alternately, the gasket 122 may be attached to the cap 120 by other means. The gasket 122 may be attached to the cap 120 such that the gasket openings 127 are positioned over the cap openings 125. In some embodiments, the gasket openings 127 and the cap openings 125 may be circular and may be substantially axially aligned.

The gasket openings 127 may be relatively smaller than the cap openings 125. With reference to FIGS. 2A-2C and 3, the relatively larger cap openings 125 may provide clearance for the leads 130 of the header 111, such that the cap 120 may not contact one or more of the leads 130 and create an undesirable conductive connection between the cap 120 and the leads 130. In some embodiments, the cap 120 may be configured to contact one or more of the leads 130 to create a particular conductive connection. For example, in some embodiments, the cap 120 may be conductively connected to a ground lead of the leads 130.

The relatively smaller gasket openings 127 and the position of the gasket 122 on the cap 120 may facilitate positioning the leads 130 in a desired position relative to the cap openings 125. For example, the gasket 122 may be attached to the cap 120 such that each of the gasket openings 127 may be approximately centered relative to one of the cap openings 125. Thus, for example, when the leads 130 are located within the gasket openings 127, the leads 130 may be located approximately in the center of the cap openings 125.

As may be best seen in FIGS. 2A-2C, the assembled cap 120 and gasket 122 may be positioned on the header 111 by inserting the leads 130 into the openings formed in the gasket 122 and sliding the assembled cap 120 and gasket 122 into place. In some embodiments, the fingers 128 and/or the extension 126 may be soldered to the header 111. For example, each side along the length of each of the fingers 128 may be soldered to the header 111. Alternately or additionally, both sides of the extension 126 may be soldered to the header 111 where the extension 126 is near or in contact with the header 111.

Figure 4:
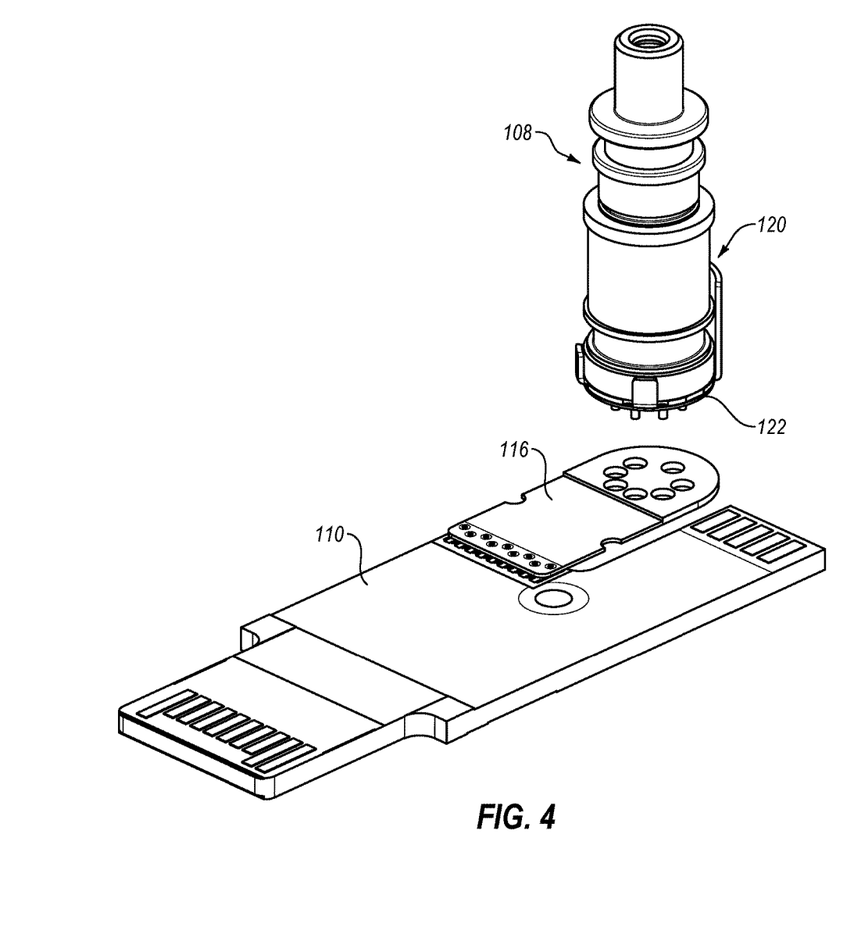
FIG. 4 illustrates an exploded perspective view of an assembly including the assembly of FIGS. 2A-2C and a printed circuit board (PCB) and connector.

FIG. 4 is an exploded perspective view of the TOSA 108, the cap 120, the gasket 122, the PCB 110, and the connector 116. In some embodiments, the connector 116 may be soldered to the PCB 110 as a step in the assembly process. In some embodiments, the assembled TOSA 108, cap 120, and gasket 122 may be soldered to the assembled connector 116 and PCB 110 at a subsequent step. The gasket 122 may discourage the connector 116 from making a conductive connection with the cap 120. In some embodiments, the gasket 122 may facilitate a particular conductive connection between the connector 116 and the cap 120. For example, a ground of the connector 116 may form a conductive connection with the cap 120.

As may be best seen in FIGS. 1A-1C, the assembled TOSA 108 and PCB 110 may be positioned and secured relative to the shell 104 and the pad 124. Other components, such as the ROSA 109, the latch mechanism 114, and the shell cover 106 may also be positioned and secured relative to the shell 104 to form the assembled optoelectronic module 100.

The invention claimed is:

1. An optoelectronic module comprising:
  a shell including a seat;
  an optical subassembly including a header having a plurality of leads;
  a thermal interface comprising:
    a thermally conductive cap including:
      a base defining a plurality of cap openings, the base having a substantially circular shape;
      a plurality of fingers extending from the base; and
      an extension extending from an edge of the base, the extension including a curved shape substantially corresponding to a circumferential portion of the base, the extension having a length greater than a length of the plurality of fingers;

a gasket defining a plurality of gasket openings smaller than the cap openings, the gasket located on the base of the cap such that the gasket openings are positioned over the cap openings, wherein the cap is positioned on the header of the optical subassembly such that the leads are located within the cap openings and the gasket openings, and the extension of the cap is positioned within the seat of the shell;

an adhesive located between the gasket and the base of the cap; and a pad located between the seat of the shell and the extension of the cap, the pad including a pliant thermal interface material.

2. The optoelectronic module of claim 1, wherein the optical subassembly includes a transmitter optical subassembly.

3. The optoelectronic module of claim 1, wherein the cap includes copper.

4. The optoelectronic module of claim 1, wherein the cap is positioned at an end face of the header of the optical subassembly.

5. The optoelectronic module of claim 1, wherein the plurality of fingers are located at a side of the header of the optical subassembly.

6. The optoelectronic module of claim 1, wherein the extension is located at a side of the header of the optical subassembly.

7. The optoelectronic module of claim 1, wherein the cap is positioned at an end face of the header of the optical subassembly and the plurality of fingers are located at a side of the header of the optical subassembly.

8. The optoelectronic module of claim 1, wherein the cap is positioned at an end face of the header of the optical subassembly and the extension is located at a side of the header of the optical subassembly.

9. The optoelectronic module of claim 1, wherein the plurality of fingers and the extension are located at a side of the header of the optical subassembly.

10. The optoelectronic module of claim 1, wherein the cap is positioned at an end face of the header of the optical subassembly and the plurality of fingers and the extension are located at a side of the header of the optical subassembly.

11. The optoelectronic module of claim 1, wherein the gasket openings are approximately centered relative to the cap openings.

12. The optoelectronic module of claim 1, wherein the pad is at least partially compressed between the seat of the shell and the extension of the cap.

13. The optoelectronic module of claim 1, wherein the pad comprises multiple portions.

14. The optoelectronic module of claim 1, wherein the plurality of fingers has a length approximately equal to a length of the header of the optical subassembly.

15. The optoelectronic module of claim 1, wherein the optical subassembly includes a high power transistor outline-can based optical subassembly.

16. The optoelectronic module of claim 1, wherein the adhesive includes an adhesive tape.

17. The optoelectronic module of claim 1, wherein the adhesive includes an epoxy.

18. The optoelectronic module of claim 1, wherein the plurality of fingers is soldered to the header of the optical subassembly.

19. The optoelectronic module of claim 1, wherein the extension is soldered to the header of the optical subassembly.

* * * * *